US006956398B1

(12) United States Patent
Mair et al.

(10) Patent No.: US 6,956,398 B1
(45) Date of Patent: Oct. 18, 2005

(54) LEAKAGE CURRENT REDUCTION METHOD

(75) Inventors: Hugh Mair, Fairview, TX (US); Luan A. Dang, Richardson, TX (US); Xiaowei Deng, Plano, TX (US); George B. Jamison, Murphy, TX (US); Tam M. Tran, Austin, TX (US); Shyh-Horng Yang, Plano, TX (US); David B. Scott, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 10/806,624

(22) Filed: Mar. 23, 2004

(51) Int. Cl.[7] .............................................. H03K 17/16
(52) U.S. Cl. ........................ 326/33; 326/17; 326/112; 326/119
(58) Field of Search ............................ 326/17, 33, 112, 326/119, 121; 327/534, 535, 537

(56) References Cited

U.S. PATENT DOCUMENTS

| 6,864,708 B2 * | 3/2005 | Takahashi et al. ............ 326/33 |
| 2001/0013806 A1 * | 8/2001 | Notani ........................ 327/534 |

* cited by examiner

*Primary Examiner*—Anh Q. Tran
(74) *Attorney, Agent, or Firm*—Alan K. Stewart; W. James Brady, III; Frederick J. Telecky, Jr.

(57) ABSTRACT

The method for powering down a circuit for a data retention mode includes: changing a supply voltage node from an active power voltage level to an inactive power level; coupling a source of a P channel device to the supply voltage node; providing a retaining power supply voltage level to a back gate of the P channel device; changing a drain voltage of the P channel device to a reference voltage level, wherein the reference voltage level is different from the retaining power supply voltage level; and changing a gate voltage of the P channel device to the reference voltage level.

8 Claims, 1 Drawing Sheet

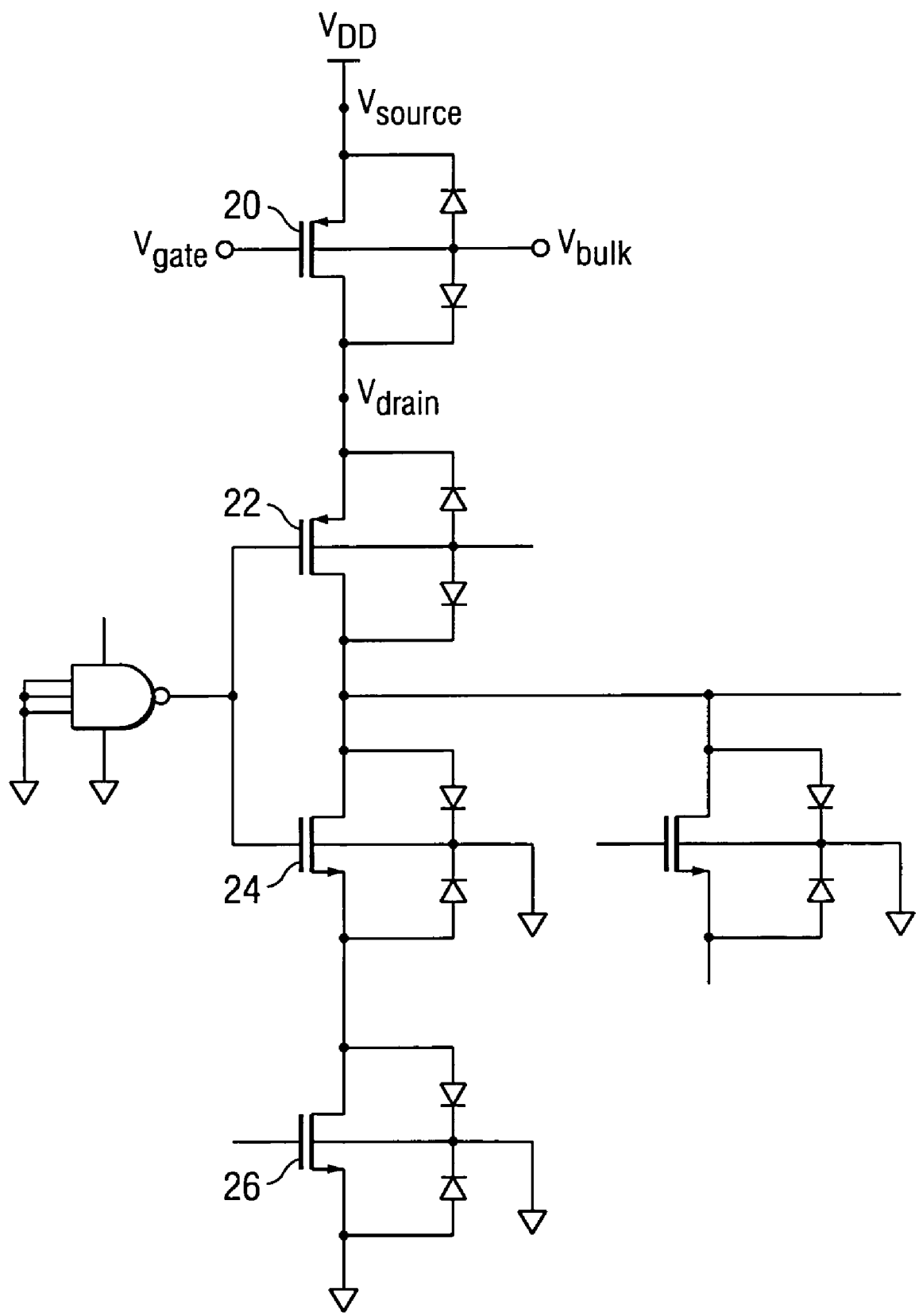

LEAKAGE CURRENT REDUCTION METHOD

FIELD OF THE INVENTION

The present invention relates to electronic circuitry and, in particular, to a leakage current reduction method.

BACKGROUND OF THE INVENTION

In a prior approach for powering down a circuit system, when the system goes into sleep/data retention mode, the main power supply VDD goes from 1.3V (in active mode) to near 0V, a retaining power supply VRET remains unchanged at, for example, 1.3V, a retain signal RET goes from 0V to VRET (1.3V) level, and some internal nodes of the system are raised to a reference voltage VBB level (for example 0.6V).

For circuits whose data needs to be retained when the system goes into sleep/data retention mode, the typical way of turning off the P Channel (PCH) device is shown below:

Vdrain=VBB (0V-->0.6V, for example)
Vgate=RET (0-->1.3V, for example)
Vsource=VDD (1.3V-->0V, for example)
Vbulk=VRET (1.3V, for example)

This is demonstrated in the wordline circuit shown in FIG. 1. This circuit has a P channel device 20 as a header. The circuit also includes P channel device 22, N channel device 24, and N channel device 26. When this circuit goes into sleep/data retention mode, source voltage Vsource goes from the active level power supply level VDD (for example 1.3V) to 0V; the drain voltage Vdrain goes to the reference voltage VBB (for example 0.6V); the gate voltage Vgate goes to the retain signal RET, which goes from 0V to retaining power supply VRET (1.3V, for example); and the back gate Vbulk goes to the retaining power supply VRET.

The problem with this prior art solution is that large voltage differences between the gate (1.3V) and the source (0V)/drain (0.6V) exist which results in large gate tunneling leakage, which dominates the P channel device leakage at room temperature since the sub-threshold leakage is suppressed by the deep back-gate bias. This leads to high standby power consumption.

SUMMARY OF THE INVENTION

A method for powering down a circuit for a data retention mode includes: changing a supply voltage node from an active power voltage level to an inactive power level; coupling a source of a P channel device to the supply voltage node; providing a retaining power supply voltage level to a back gate of the P channel device; changing a drain voltage of the P channel device to a reference voltage level, wherein the reference voltage level is different from the retaining power supply voltage level; and changing a gate voltage of the P channel device to the reference voltage level.

BRIEF DESCRIPTION OF THE DRAWINGS

In the drawings:

The Drawing is a diagram of a wordline circuit with a P channel device as header.

DETAILED DESCRIPTION OF PREFERRED EMBODIMENTS

The preferred embodiment solution to this problem is to raise the gate of the P channel device 20 to reference voltage VBB (0.6V, for example), instead of retain signal RET (1.3V, for example) when the system goes into sleep/data retention mode, as shown below:

Vdrain=VBB (0V-->0.6V)
Vgate=VBB (0-->0.6V)
Vsource=VDD (1.3V-->0V)
Vbulk=VRET (1.3V)

Since the voltage differences between the gate (0.6V) and the source (0V)/drain (0.6V) are greatly reduced, the gate tunneling leakage and standby power consumption are also greatly reduced. In fact, the leakage from the reference voltage node VBB does not contribute to any power consumption, since it is provided by the leakage from other parts of the system such as retention SRAM arrays.

A similar method can be applied to turn off the N channel device if e.g. the source is raised from 0V to 1.3V (retaining voltage), drain is raised from 0V to 0.6V (reference voltage VBB), and bulk remains at 0V when the system goes into sleep/data retention mode. In such a case, the gate can be raised to reference voltage VBB instead of kept at 0V.

One advantage of the preferred embodiment circuit is that it saves large gate leakage that helps meet leakage budget requirements when the circuit is in power down mode. Another advantage is that the leakage from the reference voltage source VBB does not contribute to any power consumption, since it is provided by the leakage from other parts of the system such as retention SRAM arrays.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A method for powering down a circuit for a data retention mode comprising:
   changing a supply voltage node from an active power voltage level to an inactive power level;
   coupling a source of a P channel device to the supply voltage node;
   providing a retaining power supply voltage level to a back gate of the P channel device;
   changing a drain voltage of the P channel device to a reference voltage level, wherein the reference voltage level is different from the retaining power supply voltage level; and
   changing a gate voltage of the P channel device to the reference voltage level.

2. The method of claim 1 wherein the reference voltage level is less than the retaining power supply voltage level.

3. The method of claim 1 wherein the reference voltage level is less than half the retaining power supply voltage level.

4. The method of claim 1 wherein the P channel device is in a wordline circuit.

5. The method of claim 1 further comprising:
   coupling a second P channel device in series with the first P channel device;
   coupling a first N channel device in series with the second P channel device; and coupling a second N channel device in series with the first N channel device.

6. The method of claim 5 further comprising:

providing the retaining power supply voltage level to a source of the second N channel device;

changing a drain of the N channel device to the reference voltage level; and changing a gate voltage of the N channel device to the reference voltage level.

7. The method of claim 1 wherein the retaining power supply voltage level is the same as the active power voltage level.

8. The method of claim 1 wherein the active power voltage level is 1.3V, the inactive power level is 0V, the reference voltage level is 0.6V, the retaining power supply voltage level is 1.3V.

* * * * *